United States Patent [19]

Behrens et al.

[11] Patent Number: 4,821,146

[45] Date of Patent: Apr. 11, 1989

[54] PLUGABLE INTERPOSER AND PRINTED CIRCUIT CARD CARRIER

[75] Inventors: Linda M. Behrens, Byron; Neil A. Blohm, Rochester; Raymond L. Cimijotti, Chatfield; William D. Corfits; Jerry R. Rasmussen, both of Rochester, all of Minn.

[73] Assignee: International Business Machines Corporation, Armonk, N.Y.

[21] Appl. No.: 121,482

[22] Filed: Nov. 17, 1987

[51] Int. Cl.[4] ............................................. H05K 7/20
[52] U.S. Cl. ................... 361/383; 174/35 R; 211/41; 361/395; 361/399; 361/413; 361/424
[58] Field of Search .......... 174/35 R, 35 MS, 35 GC, 174/51, ; 211/41; 361/392–395, 413, 415, 422, 424, 380–381, 383–384; 439/341, 59–62, 64, 65, 76, 101, 108, 607, 609

[56] References Cited

U.S. PATENT DOCUMENTS

| | | |
|---|---|---|
| 2,602,842 | 6/1949 | Morris et al. . |
| 2,944,864 | 8/1957 | Krivulka . |
| 3,218,518 | 11/1965 | Ashbridge et al. . |
| 3,311,863 | 3/1967 | Beale ............................... 361/391 X |
| 4,152,750 | 5/1979 | Bremenour et al. . |
| 4,313,150 | 1/1982 | Chu ...................................... 361/399 |
| 4,386,388 | 5/1983 | Beun . |
| 4,602,835 | 7/1986 | Bauer et al. ...................... 439/108 X |
| 4,631,641 | 12/1986 | Brombal et al. ................... 174/35 R |
| 4,672,511 | 6/1987 | Meusel et al. ................... 361/380 X |

FOREIGN PATENT DOCUMENTS

| | | |
|---|---|---|
| 3038719 | 10/1981 | Fed. Rep. of Germany ...... 361/383 |
| 0888944 | 2/1962 | United Kingdom ................ 361/388 |

Primary Examiner—A. D. Pellinen
Assistant Examiner—Gregory D. Thompson
Attorney, Agent, or Firm—Hugh D. Jaeger; Carl W. Laumann, Jr.

[57] ABSTRACT

A plugable interposer assembly for enclosing printed circuit cards used in electronic devices and accommodating the connection of cables and additional printed circuit card enclosures. The enclosure is completely shielded and is particularly adapted to use in circumstances where unskilled persons either plug or unplug the assembly into a backplane assembly.

14 Claims, 8 Drawing Sheets

PLUGABLE INTERPOSER AND PRINTED CIRCUIT CARD CARRIER

CROSS REFERENCES TO RELATED APPLICATIONS

The invention described in this application is related to the invention described in co-pending application Ser. No. 121,436, filed on Nov. 17, 1987, the same day as this application, entitled "Pluggable Assembly for Printed Circuit Cards".

TECHNICAL FIELD

This invention relates generally to a shielded, pluggable, mounting enclosure for printed circuit cards such as used in a computer.

BACKGROUND ART

Improvements in semiconductor technology have contributed to a manyfold increase in the number of electronic devices used in everyday life. The reduced size and cost of transistors and integrated circuits have made many electronic devices virtual necessities to every day life. The expansion of electronic devices has occurred in the work place as well as the home, bringing people with virtually no electronic experience or skills into contact as purchasers and users.

There are two seemingly unrelated problems resulting from this expansion of electronics. First, there is an ever increasing problem of electromagnetic interference caused by such devices. Virtually every electronic device, intentionally or not, emits some form of electromagnetic radiation. While this condition could be tolerated when few devices existed, the increasing number of electronic devices has made the problem more acute. The problem has been exacerbated by the "improvement" in semiconductor devices which allows them to operate at higher speeds, generally causing emission in the higher frequency bands where interference is more likely to occur. Successful minimization of the interference problem, sometimes referred to as "electro-magnetic compatibility" or "EMC", generally requires that emissions from a given device be reduced by shielding and other means, and shielding be employed to reduce the sensitivity of a device to fields from other devices. Since shielding helps to reduce sensitivity to external fields as well as reduce emissions from the device, it is a common approach to a solution of the problem.

Another problem which has arisen with the reduced cost and size of customer/user to perform tasks which were formerly performed by highly skilled maintenance and service personnel. Today, when a computer is purchased it is not uncommon for the purchaser to literally carry it out of the store. This means that the set-up and installation of features must be done by the customer, who seldom has any specialized electronic skills. this situation mandates that the set-up and installation of features be very simple and virtually foolproof.

Looking now at the problems as they co-exist, it would be unrealistic to expect an unskilled user to be able to cope with the complex interlocking shielding or even fingerstock commonly used to achieve an adequate level of shielding. The prior art shielded enclosures have been designed for use by skilled technicians and often require the use of tools during installation and removal. Even further, even the plugging of circuit cards which contain upwards of twenty contacts is something not reliably accomplished by the unskilled user.

An additional problem is created when cables or supplementary or "add on" cards are to be connected to a system. Such devices commonly must be accurately plugged to avoid damage or improper operation of the system. The inadvertent unplugging of a cable while the system is in operation may create errors which completely disable the system.

DISCLOSURE OF THE INVENTION

This invention provides a package for large and small printed circuit cards, easily handled and plugged by the unskilled user, which provides a very high degree of electromagnetic shielding and can serve as an interposer to accommodate the connection of cables as well.

The package includes a book-like housing, which can totally enclose and shield a circuit card, adapted to be plugged into a host assembly such as a computer backplane. The housing is easily adapted to polarization to prevent individual housings from being plugged into inappropriate slots in the backplane. The housing may include camming handles which serve to force the housing into the receiving socket, hold the housing in place after plugging, and serve to cam the housing out of the socket when the housing is to be removed. The housing includes a socket adapted for the connection of additional card enclosures or cables.

The housing has accommodation for the flow of cooling air over the enclosed circuit card to prevent overheating.

DESCRIPTION OF THE INVENTION

Figure 1:
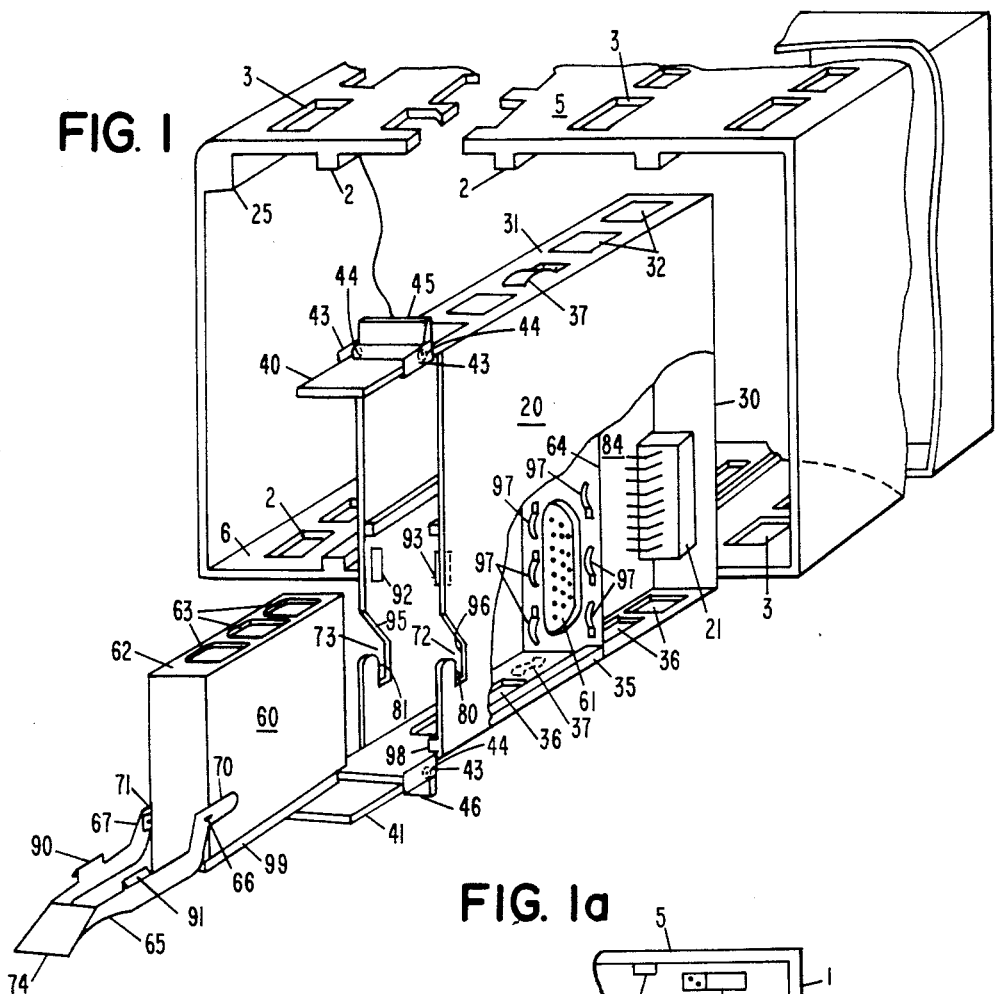
FIG. 1 is a partial isometric view of a portion of an assembly showing a pluggable printed circuit card enclosure according to the invention.

With reference to FIG. 1, a computer backplane assembly comprises an enclosure 1 having a plurality of positions for card enclosures separated by guide rails 2. Cooling air holes 3 are located on the top surface 5 and the bottom surface 6. The rear of the enclosure 1 includes a plurality of connectors and grounding springs as shown in FIG. 1a.

Figure 1B:
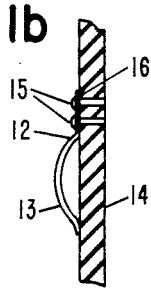
FIG. 1b is a sectional view of a grounding spring shown in FIG. 1a taken along the line 1b—1b.
Figure 1A:
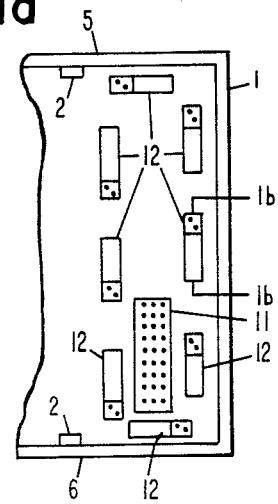
FIG. 1a is a partial front view of the right rear corner of the system backplane showing the arrangement of the connector and grounding springs.

With reference to FIG. 1a, which is a partial front view showing the right rear portion of the backplane enclosure 1, a connector 11 is positioned to accept a complementary connector 21 on a pluggable card assembly 20. A plurality of grounding springs 12 are positioned around the connector to provide shielding. The shape of grounding springs 12 is shown in FIG. 1b, which is a partial sectional view taken along the line 1b—1b of FIG. 1a. Each of the grounding springs 12 has a curved portion 13 which is deflected backwardly toward rear wall 14 by the rear surface of the pluggable enclosure. The grounding springs 12 are fastened to the rear wall 14 by appropriate fasteners such as screws 15 which pass through the flat portion 16.

Pluggable interposer card assembly 20 is adapted to fit between the guide rails 2. If it is desired to restrict the pluggable interposer card assembly 20 to a single plug position, suitable keys can be provided on the enclosure 1 to prevent misplugging. For example, an enlarged corner key 25, which is adapted to fit a pluggable interposer card assembly having the upper left corner recessed to fit the corner key 25, can be provided to prevent plugging of assemblies which lack the correct key.

The pluggable interposer card assembly 20 includes a back, or first end, 30 on which the complementary connector 21 is mounted. The back end 30 is essentially flat to provide a good grounding surface for grounding springs 12. The top 31 of the enclosure contains a plurality of openings 32 to accommodate the flow of cooling air. The bottom 35 contains a plurality of openings 36 to accommodate the flow of cooling air. Suitable means, such as a fan, may be used to force cooling air through the cooling air holes 3, the pluggable interposer card assembly 20 and out the openings 36. A grounding spring 37 is positioned on the top of pluggable interposer card assembly 20 for engaging the inner surface of the enclosure 1, and providing an improved connection of the metallic, or otherwise conductive material of the sides, back, top and bottom of assembly to ground for shielding purposes.

A printed circuit card 84, having connections to complementary connector 21 and connector 61, is mounted within pluggable interposer card assembly 20. The embodiment shown in FIG. 1 is illustrative of an embodiment in which the circuit card occupies only a portion of the pluggable interposer card assembly 20. Alternatively, the circuit card can occupy the entire enclosure, in which case the open front portion 38 would be replaced with a solid face as will be later described.

A pair of handles 40 and 41 are pivotally mounted on bosses 44 supported by projections 43 extending from the sides of pluggable interposer card assembly 20. These handles may be used to disengage the assembly from the backplane by forcing handle 40 upwardly and handle 41 downwardly. The shorter portions 45 and 46 are thus brought to bear against the abutting front surface of the enclosure or assembly 1 and serve to cam the assembly for disengagement with the enclosure 1.

A smaller, pluggable "daughter" printed circuit card enclosure 60 is adapted to fit with the pluggable interposer card assembly 20 and make contact with the connector 61, mounted on partition 64 by means of a complementary connector, not shown, on the rear of the assembly. Enclosure 60 has holes 63 in the top surface 62, which coact with the openings 32 to provide a flow of cooling air over the electronic circuitry with the enclosure. The bottom surface of enclosure 60 also contains holes, not shown, for the passage of cooling air. A handle 65, pivoted at points 66 and 67, has a pair of ears 70 and 71 which coact with the slots 72 and 73 in the sides of pluggable interposer card assembly 20. The enclosure 60 is pushed inwardly until the ends of ears 70 and 71 come to bear against the back edge of slots 72 and 73. At this point the finger tab 74 is moved upwardly, causing the ears 70 and 71 to bear against the inner edges 80 and 81 of slots 72 and 73. Continued movement of finger tab 74 in the clockwise direction causes the pivot points 66 and 67 to cam against the inner edges 80 and 81 and force the connector of enclosure 60 into engagement with connector 61.

As the ears 70 and 71 reach the final position against the inner edges 80 and 81 of slots 72 and 73, the latching tongues 90 and 91 engage the catches 92 and 93, respectively, to hold the finger tab 74 in the latched position. The finger tab 74 can be disengaged by pressing the latching tongues 90 and 91 inwardly to disengage from the catches 92 and 93 and then pulling the finger tab downwardly.

Figure 1C:
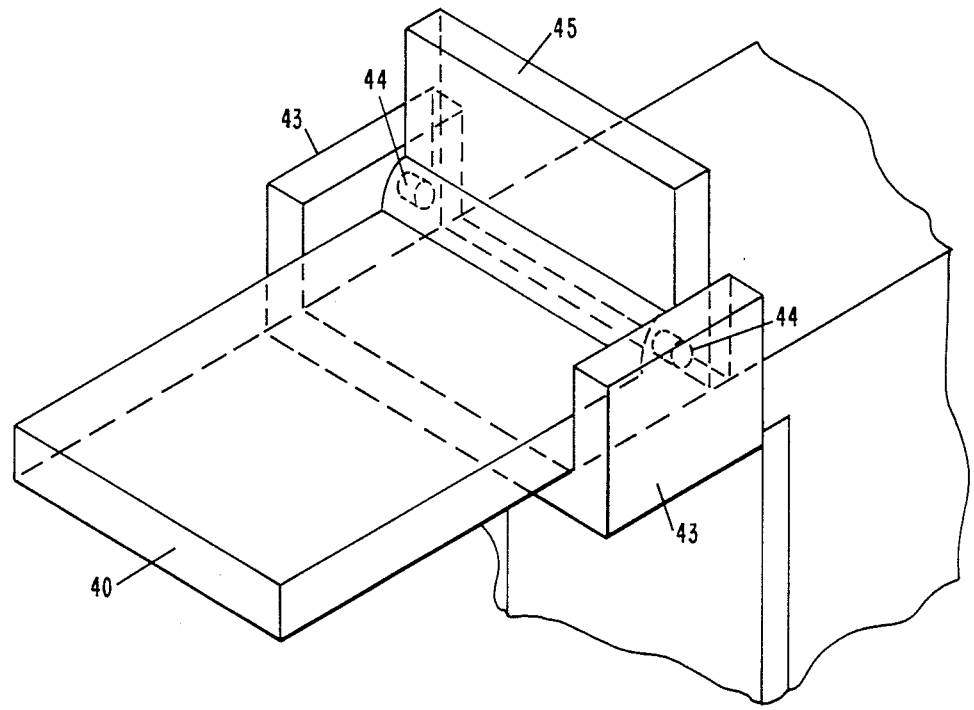
FIG. 1c is a partial isometric view of the handle mechanism used to extract the pluggable printed circuit card enclosure from the system backplane.

FIG. 1c shows the arrangement of bosses 44 on the interior of the projections 43. The bosses provide pivotal support for handles 40 and 41.

Figure 2:
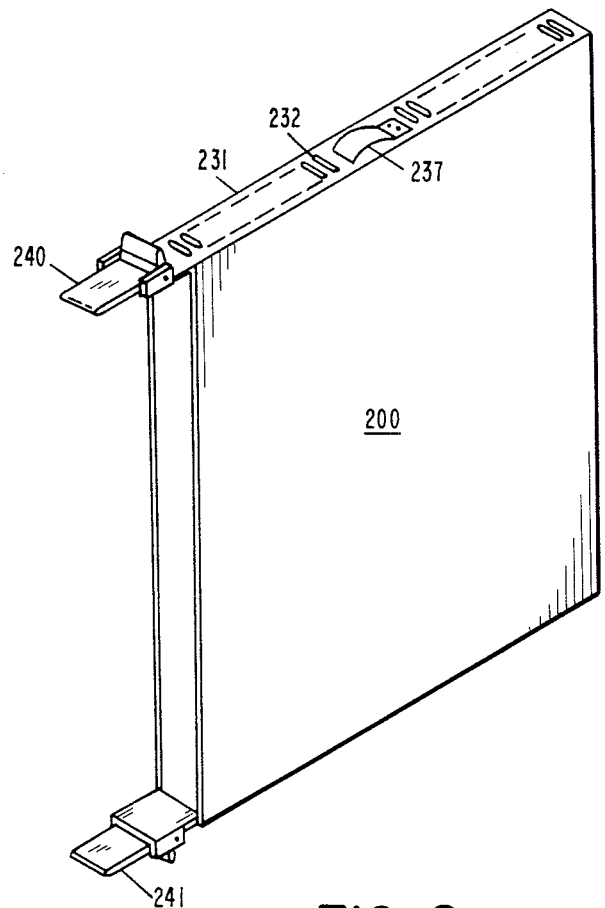
FIG. 2 is an isometric view of a pluggable printed circuit card enclosure according to the invention.

FIG. 2 shows an alternative form of enclosure for plugging into the enclosure 1. The printed circuit card enclosure 200 is proportioned to accommodate a larger card than the enclosure 60 previously described. Typical of such a larger card would be the card containing the processor circuitry or basis increment of memory for a small computer. The enclosure 200 contains no accommodation for the plugging of additional enclosures and therefore has a solid cover throughout. The enclosure 200 would be plugged into a slot similar to the slot which receives the pluggable card assembly 20. In a fashion similar to pluggable interposer card assembly 20, the enclosure 200 has a grounding spring 237 on the top for coaction with the inner portion of the top of backplane assembly 1. Enclosure 200 also has handles 240 and 241 which serve the same purpose as the comparable elements of pluggable interposer card assembly 20. The shape of the holes 232 in the top 231 of enclosure 200 is somewhat different than the shape of the openings 32 in the pluggable card assembly 20. The smaller, thinner holes may be desired when the circuitry contained within the enclosure is more sensitive to interference or has a greater tendency to emit radiation in an undesired spectrum.

Figure 3:
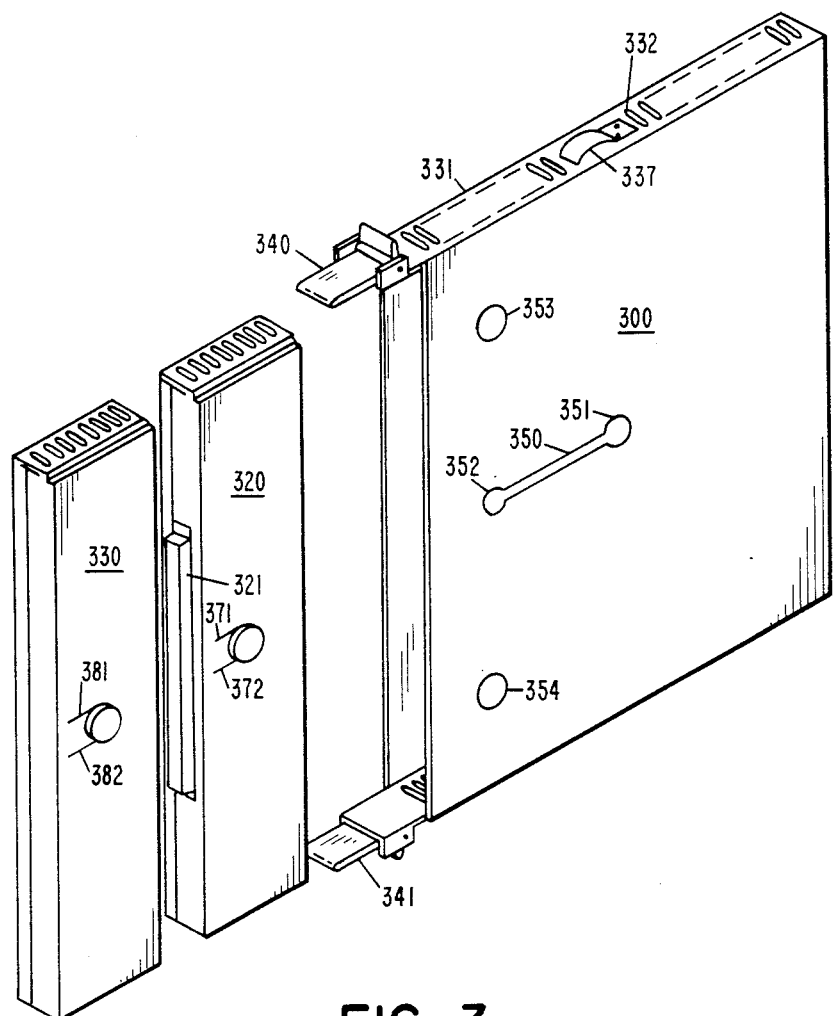
FIG. 3 is an isometric view of a pluggable printed circuit card enclosure according to the invention wherein multiple cards may be serially plugged into the enclosure.

FIG. 3 is illustrative of another embodiment of the pluggable enclosure. It is desirable in some circumstances to provide a "piggyback" arrangement for optional printed circuit cards when those added later must rely on certain circuit features in earlier added cards, or where a plurality of cards share a common bus, such as memory cards. The basic enclosure 300, occupies the full depth of the enclosure 1. It has the same type of holes 332 in top 331 for air flow and the same type of handles 340 and 341 for extraction of the enclosure from the backplane. The front of the enclosure 300 has an opening of sufficient width to accommodate the insertion of the smaller pluggable assemblies 320 and 330, each of which may have a suitable connector 321 and a connector on the back of enclosure 320 which is not shown. A slot 350 in the side of enclosure 300 has a pair of holes at the extremities. The holes are slightly larger than the corresponding buttons 371 and 381 on enclosures 320 and 330, respectively. Each of the buttons is mounted on a flexible tab portion of the side of the smaller enclosure. Tab portion 372 of enclosure 320 allows the button 371, and its counterpart on the opposite side of enclosure 320, to be deflected inwardly to allow the enclosure 320 to be inserted into the open end of the enclosure 300. The smaller enclosure is pushed into the larger until the connector, not shown, mates with the connector, not shown, on the inside of enclosure 300. At this point, button 371 lines up with slot 351 and pops out into slot 351 to retain the enclosure 320 in place. It will be appreciated that the button 371 will first pop out into the hole 352 and must be again deflected inwardly to allow completion of the insertion process.

The enclosure 330 may then be inserted into enclosure 300 in like fashion, locking into place when the button 381, on tab 382, pops out into hole 352.

Removal of the piggyback enclosures is accomplished by depressing the buttons inwardly to disengage them from the holes and urging the enclosure outwardly.

The additional holes 353 and 354 are positioned to accommodate a three piggyback enclosures having one third the length of those shown. Each one of the enclosures would then latch into one of the holes 352, 353, and 354.

Figure 4:
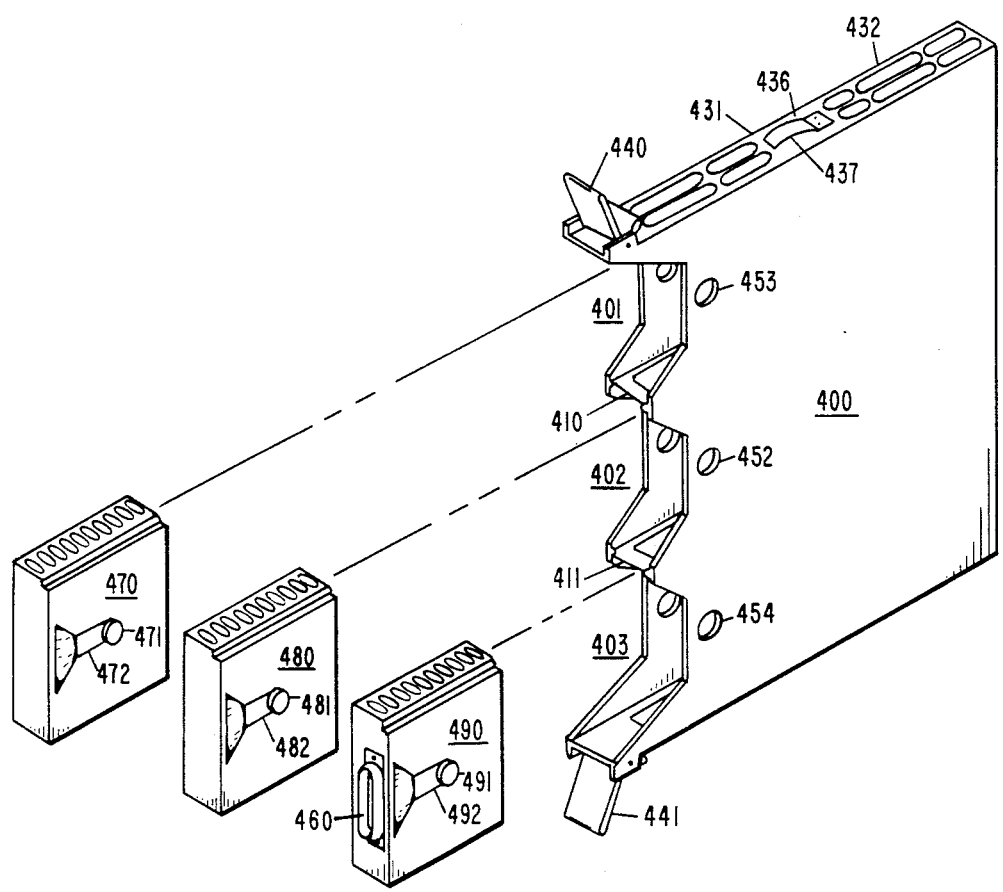
FIG. 4 is an isometric view of a pluggable printed circuit card enclosure according to the invention wherein multiple cards may be adjacently plugged into the enclosure.

A further alternative embodiment of pluggable enclosure is shown in FIG. 4. In this embodiment, the top 431 of enclosure 400 has a plurality of air holes 432. Latches 440 and 441 provide the same function as previously described. A grounding spring 437 functions in the same manner as that for the earlier described embodiments.

The enclosure 400 is designed to accommodate the plugging of three smaller enclosures 470, 480 and 490. Each of these smaller enclosures has the same sort of locking buttons 471, 481 and 491 as that described with reference to the embodiment of FIG. 3. The locking buttons are mounted on flexible tongues 472, 482 and 492, respectively, to allow them to be deflected inwardly during the process of insertion into enclosure 400. It will be observed that the front of enclosure 400 has three cut-out portions 401, 402 and 403 to provide an area where the fingers can easily grasp the enclosure 470, 480 and 490 during the insertion and removal process. The holes 452, 453 and 454 coact with the buttons 471, 481 and 491 to lock the smaller enclosures in place.

If desired, one of the enclosures, for example enclosure 490, may have a socket 460 for the connection of a cable leading to a printer or other peripheral device.

To simplify the insertion process, guide rails 410 and 411 are located with the enclosure 400 to accurately position the individual smaller enclosures as they slid into place.

Figure 5:
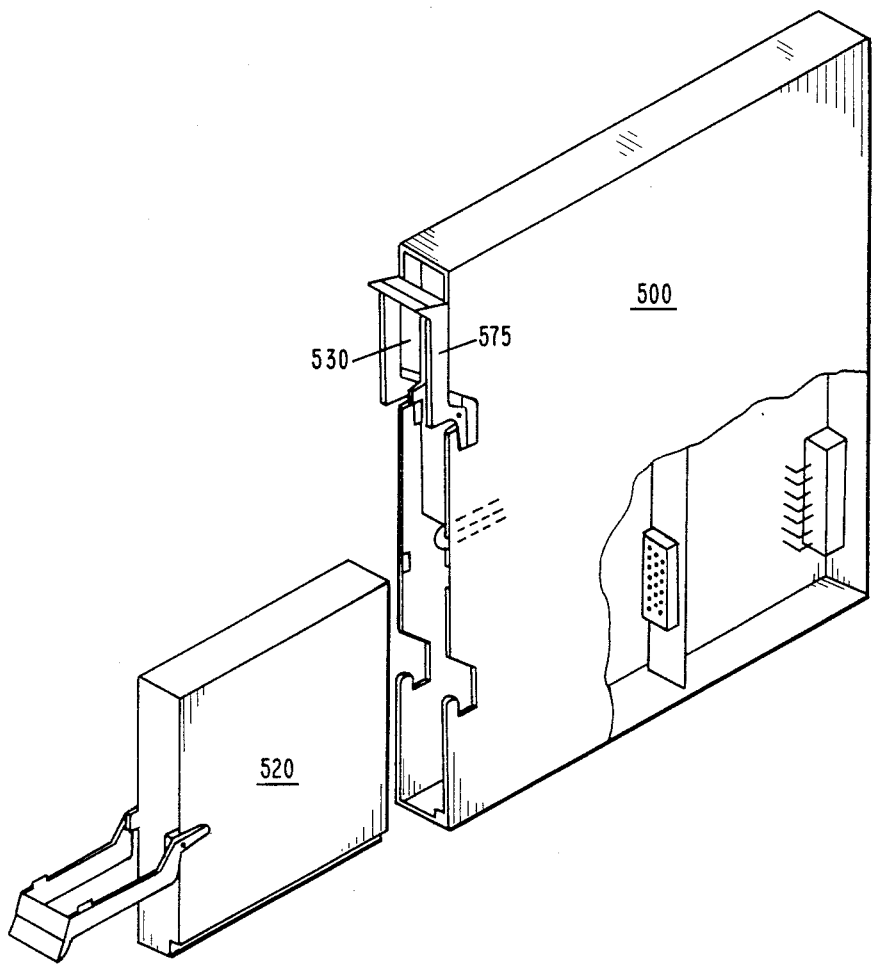
FIG. 5 is an isometric view of a pluggable printed circuit card enclosure according to the invention wherein multiple cards may be plugged into the enclosure and held in position with a lever type latch which assists in the plugging and unplugging operation.

The embodiment of FIG. 5 shows a larger pluggable enclosure 500 with one smaller enclosure 520 in position for insertion and one smaller enclosure 530 in the plugged position, illustrating the manner in which the handle 565 locks the enclosure in the plugged position.

Figure 6:
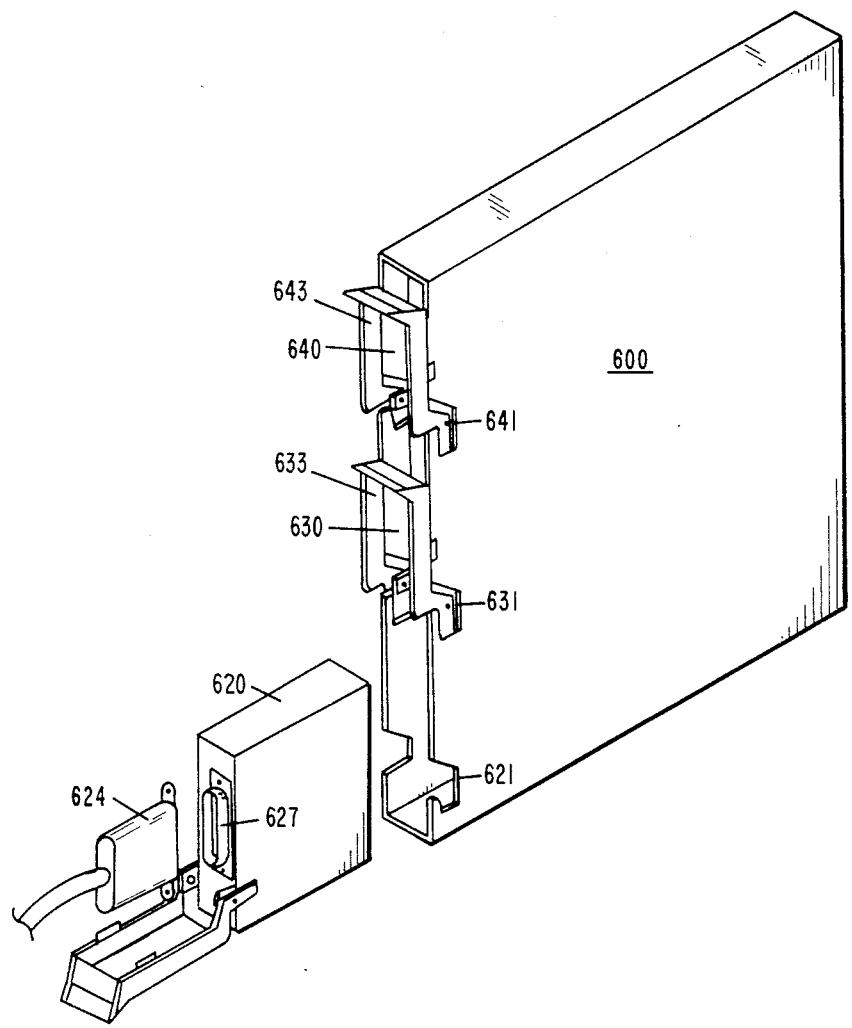
FIG. 6 is an isometric view of a pluggable printed circuit card enclosure according to the invention wherein multiple cards may be plugged into the enclosure for the accommodation of pluggable printed circuit card enclosures shown in FIG. 5.

The embodiment of FIG. 6 is similar to that of FIGS. 4 and 5. The larger pluggable enclosure 600 includes a provision for insertion of a variety of smaller pluggable enclosures 620, 630, and 640, each of which has a corresponding slot 621, 631, and 641 in the side walls of enclosure 600 for the locking handles 623, 633 and 643, respectively.

The cable connector 624 is plugged into cable connector socket 627 after insertion of the enclosure 620 into enclosure 600 and after handle 623 is locked in place as described with reference to FIG. 1. This locks enclosure 620 in place and it cannot be removed without first removing connector plug 624 from socket 627. This is desirable because of the adverse effect on system operation caused by the inadvertent disconnection of an I/O module such as contained in enclosure 620 during operation of a system. The error condition caused by such disconnection is one from which a typical computer system has a difficult time recovering, and it is therefore desirable to avoid.

Figure 7:
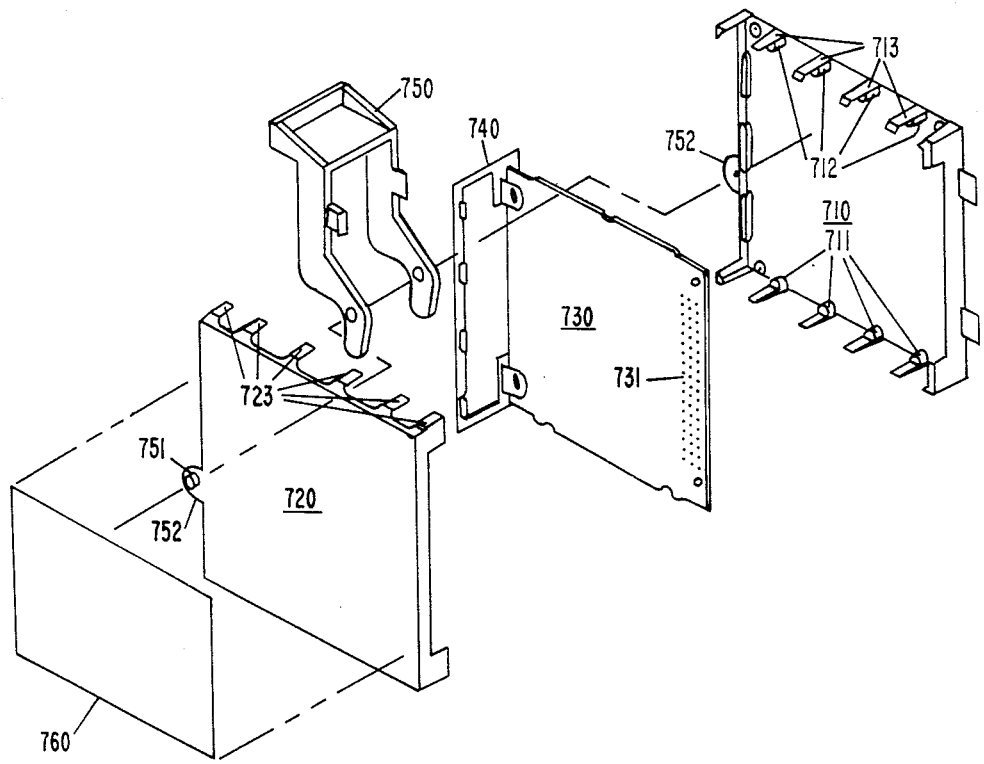
FIG. 7 is an exploded view of a smaller pluggable printed circuit card enclosure showing the arrangement of the printed circuit card and an identifying label.

FIG. 7 is an exploded view of a smaller pluggable enclosure such as enclosure 520 shown in FIG. 5. This enclosure is suitable for holding a printed circuit card for the implantation of a feature which may be optional. That is, a standard minimum computer configuration might not require inclusion of the feature contained in this enclosure. The enclosure includes a left side 710, a right side 720, and a printed circuit card 730 mounted in the front 740. The circuit card 730 is spaced from side 710 by molding projections 711 and 712. A plurality of holes 731 connected to land patterns, not shown, on the circuit board 730 accommodate the lead wires to a connector mounted on the back of the enclosure. The handle 750 is pivotally mounted on bosses 751 extending from the ears 752. Holes for cooling air are provided by the opposing interlocking fingers 723 and 713 on sides 720 and 710, respectively. A label 760 may be affixed to the side 720 for identification purposes.

Suitable materials for the fabrication of the pluggable assemblies of this invention include metals and other conductive materials having the requisite conductivity for EMC purposes and the requisite mechanical strength to accommodate the forces encountered in plugging and unplugging the assemblies and cables.

We claim:

1. An interposer assembly, having a circuit card therein, for providing connection of an additional circuit card or cable to a system backplane, comprising:
    a. a conductive housing having a top, a bottom, sides, a back and a first connector positioned on said back thereof for mating and connection with a system backplane;
    b. a second connector affixed to a partition positioned within said housing, said partition connected to said housing and said second connector connected to said circuit card therein; and,
    c. a plurality of openings in the top and bottom of said housing for the flow of cooling air.

2. An interposer assembly according to claim 1 wherein said partition is a solid conductive member coacting with said sides and said back to constrain air flowing through said housing between said top and said bottom and providing electromagnetic shielding for said circuit card positioned within.

3. An interposer assembly according to claim 2 wherein said openings provide air flow over both sides of said card therein.

4. An interposer assembly according to claim 2 having at least one grounding spring affixed to said top and bottom for engagement with a surface of said system backplane.

5. An interposer assembly according to claim 1 wherein said back has a flat region surrounding said connector for engagement with grounding springs affixed to said system backplane.

6. An interposer assembly according to claim 1 further including:
   a. a pair of projections extending forwardly from said housing;
   b. a boss positioned to face inwardly on each of said projections; and,
   c. a handle pivotally mounted on each of said bosses.

7. A shield circuit card enclosure for connection to a shielded interposer having a connector positioned therein comprising:
   a. a conductive housing having a top, bottom, sides and a front;
   b. a connector positioned on a back to mate with a connector within said interposer;
   c. latch means positioned on said housing for engagement with said interposer to retain said housing within said interposer;
   d. a plurality of openings in said top and bottom for coaction with corresponding openings in said interposer for the flow of cooling air through said housing;
   e. a cable connector socket positioned on said front for mating with an interconnecting cable connector plug; and
   f. said latch means is prevented from movement from a latched to an unlatched position when a cable connector plug is plugged into said cable connector socket.

8. In combination:
   a. a shielded interposer assembly having a top, bottom, back, front and sides and having a circuit card mounted therein;
   b. a first connector mounted on the back of said interposer for connection of said circuit card to a system backplane;
   c. a second connector mounted inside said interposer for connection of said circuit card to a shielded card enclosure;
   d. a shielded card enclosure having a top, bottom, back, front and sides and having a circuit card mounted therein;
   e. a third connector mounted on the back of said card enclosure for connection to said second connector when said enclosure is placed within said interposer;
   f. a plurality of openings in the top and bottom of said interposer for the flow of cooling air over said circuit card in said interposer; and,
   g. a plurality of openings in the top and bottom of said card enclosure for coaction with said openings in said interposer to provide a flow of cooling air over said circuit card in said card enclosure.

9. The combination of claim 8 wherein said tops, fronts, backs and sides are metallic.

10. The combination of claim 8 further including:
    a. latch means positioned on said card enclosure for engagement with said interposer to retain said enclosure within said interposer.

11. The combination of claim 10 further including:
    a. a fourth connector socket, positioned on the front of said card enclosure, for mating with an interconnecting cable connector plug.

12. The combination of claim 11 wherein said latch means is prevented from movement from a latched to an unlatched position when a cable is plugged into said cable connector.

13. A shielded circuit card enclosure for connection of a cable, comprising:
    a. a first connector affixed to said enclosure and receiving a cable connector; and,
    b. pivotable latch means affixed to said enclosure adjacent said first connector for retention of said enclosure within an assembly whereby movement of said latch means from a latched to an unlatched position is prevented when a cable is plugged into said first connector.

14. An enclosure according to claim 13 wherein said latch means includes a handle portion, through which a cable passes when said latch is locked and a cable is plugged into said first connector, which prevents movement of said handle portion from a latched to an unlatched position.

* * * * *